(12) United States Patent
Thorum et al.

(10) Patent No.: US 9,617,648 B2
(45) Date of Patent: Apr. 11, 2017

(54) PRETREATMENT OF NICKEL AND COBALT LINERS FOR ELECTRODEPOSITION OF COPPER INTO THROUGH SILICON VIAS

(71) Applicant: Lam Research Corporation, Fremont, CA (US)

(72) Inventors: Matthew S. Thorum, Tigard, OR (US); Steven T. Mayer, Aurora, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/638,750

(22) Filed: Mar. 4, 2015

(65) Prior Publication Data
US 2016/0258078 A1    Sep. 8, 2016

(51) Int. Cl.
*H01L 21/768* (2006.01)
*C25D 7/12* (2006.01)
(Continued)

(52) U.S. Cl.
CPC ............. *C25D 7/123* (2013.01); *C25D 3/38* (2013.01); *C25D 5/34* (2013.01); *C25D 17/001* (2013.01);
(Continued)

(58) Field of Classification Search
CPC ......... H01L 21/02365; H01L 21/02518; H01L 21/02623; H01L 23/53204
See application file for complete search history.

(56) References Cited

U.S. PATENT DOCUMENTS

| 1,255,395 A | 2/1918 | Duram |
| 3,360,248 A | 12/1967 | Lindeman et al. |
| (Continued) | | |

FOREIGN PATENT DOCUMENTS

| CN | 102286760 A | 12/2011 |
| CN | 102677139 A | 9/2012 |
| (Continued) | | |

OTHER PUBLICATIONS

US Office Action, dated Nov. 12, 2015, issued in U.S. Appl. No. 14/182,767.
(Continued)

*Primary Examiner* — Cheung Lee
(74) *Attorney, Agent, or Firm* — Weaver Austin Villeneuve & Sampson LLP

(57) ABSTRACT

Prior to electrodeposition of copper onto a nickel-containing or a cobalt-containing seed layer, a semiconductor wafer is pretreated by contacting the seed layer with a pre-wetting liquid comprising cupric ions at a concentration of at least about 10 g/L, more preferably of at least about 30 g/L, and an electroplating suppressor, such as a compound from the class of polyalkylene glycols. This pre-treatment is particularly useful for wafers having one or more large recessed features, such as through silicon vias (TSVs). The pre-wetting liquid is preferably degassed prior to contact with the wafer substrate. The pretreatment is preferably performed under subatmospheric pressure to prevent bubble formation within the recessed features. After the wafer is pretreated, copper is electrodeposited from an electroplating solution (such as an acidic electroplating solution) to fill the recessed features on the wafer. The described pretreatment minimizes corrosion of seed layer during electroplating and reduces plating defects.

18 Claims, 9 Drawing Sheets

(51) Int. Cl.

| | | |
|---|---|---|
| C25D 17/00 | (2006.01) | |
| C25D 5/34 | (2006.01) | |
| C25D 3/38 | (2006.01) | |
| H01L 21/288 | (2006.01) | |
| H01L 23/532 | (2006.01) | |
| H01L 23/48 | (2006.01) | |

(52) U.S. Cl.
CPC .... *H01L 21/2885* (2013.01); *H01L 21/76873* (2013.01); *H01L 21/76877* (2013.01); *H01L 21/76879* (2013.01); *H01L 21/76898* (2013.01); *H01L 23/481* (2013.01); *H01L 23/53238* (2013.01)

(56) References Cited

U.S. PATENT DOCUMENTS

| | | | |
|---|---|---|---|
| 3,849,002 | A | 11/1974 | Hach |
| 4,101,919 | A | 7/1978 | Ammann |
| 4,229,191 | A | 10/1980 | Moore |
| 4,297,217 | A | 10/1981 | Hines et al. |
| 4,816,081 | A | 3/1989 | Mehta et al. |
| 5,000,827 | A | 3/1991 | Schuster et al. |
| 5,221,449 | A | 6/1993 | Colgan et al. |
| 5,281,485 | A | 1/1994 | Colgan et al. |
| 5,427,674 | A | 6/1995 | Langenskiold et al. |
| 5,482,611 | A | 1/1996 | Helmer et al. |
| 5,555,234 | A | 9/1996 | Sugimoto |
| 5,800,626 | A | 9/1998 | Cohen et al. |
| 5,831,727 | A | 11/1998 | Stream |
| 5,982,762 | A | 11/1999 | Anzai et al. |
| 5,985,762 | A | 11/1999 | Geffken et al. |
| 6,004,470 | A | 12/1999 | Abril |
| 6,017,437 | A | 1/2000 | Ting et al. |
| 6,074,544 | A | 6/2000 | Reid et al. |
| 6,099,702 | A | 8/2000 | Reid et al. |
| 6,110,346 | A | 8/2000 | Reid et al. |
| 6,124,203 | A | 9/2000 | Joo et al. |
| 6,126,798 | A | 10/2000 | Reid et al. |
| 6,139,712 | A | 10/2000 | Patton et al. |
| 6,156,167 | A | 12/2000 | Patton et al. |
| 6,159,354 | A | 12/2000 | Contolini et al. |
| 6,162,344 | A | 12/2000 | Reid et al. |
| 6,179,973 | B1 | 1/2001 | Lai et al. |
| 6,179,983 | B1 | 1/2001 | Reid et al. |
| 6,193,854 | B1 | 2/2001 | Lai et al. |
| 6,193,859 | B1 | 2/2001 | Contolini et al. |
| 6,217,716 | B1 | 4/2001 | Fai Lai |
| 6,221,757 | B1 | 4/2001 | Schmidbauer et al. |
| 6,251,242 | B1 | 6/2001 | Fu et al. |
| 6,261,433 | B1 | 7/2001 | Landau |
| 6,274,008 | B1 | 8/2001 | Gopalraja et al. |
| 6,277,249 | B1 | 8/2001 | Gopalraja et al. |
| 6,333,275 | B1 | 12/2001 | Feng et al. |
| 6,413,388 | B1 | 7/2002 | Uzoh et al. |
| 6,503,376 | B2 | 1/2003 | Toyoda et al. |
| 6,540,899 | B2 | 4/2003 | Keigler |
| 6,544,585 | B1 | 4/2003 | Kuriyama et al. |
| 6,551,487 | B1 | 4/2003 | Reid et al. |
| 6,562,204 | B1 | 5/2003 | Mayer et al. |
| 6,569,299 | B1 | 5/2003 | Reid et al. |
| 6,582,578 | B1 | 6/2003 | Dordi et al. |
| 6,596,148 | B1 | 7/2003 | Belongia et al. |
| 6,689,257 | B2 | 2/2004 | Mishima et al. |
| 6,716,332 | B1 | 4/2004 | Yoshioka |
| 6,753,250 | B1 | 6/2004 | Hill et al. |
| 6,800,187 | B1 | 10/2004 | Reid et al. |
| 6,964,792 | B1 | 11/2005 | Mayer et al. |
| 7,014,679 | B2 | 3/2006 | Parekh et al. |
| 7,097,410 | B1 | 8/2006 | Reid et al. |
| 7,270,734 | B1 | 9/2007 | Schetty, III et al. |
| 7,303,992 | B2 | 12/2007 | Paneccasio et al. |
| 7,670,950 | B2 | 3/2010 | Richardson et al. |
| 7,686,927 | B1 | 3/2010 | Reid et al. |
| 7,771,662 | B2 | 8/2010 | Pressman et al. |
| 7,776,741 | B2 | 8/2010 | Reid et al. |
| 8,404,095 | B2 | 3/2013 | Perkins et al. |
| 8,795,480 | B2 | 8/2014 | Mayer et al. |
| 8,962,085 | B2 | 2/2015 | Mayer et al. |
| 8,992,757 | B2 | 3/2015 | Willey et al. |
| 9,138,784 | B1 | 9/2015 | Hawkins et al. |
| 9,435,049 | B2 | 9/2016 | Thorum |
| 9,455,139 | B2 | 9/2016 | Buckalew et al. |
| 9,481,942 | B2 | 11/2016 | Zhou et al. |
| 2001/0015321 | A1 | 8/2001 | Reid et al. |
| 2001/0035346 | A1 | 11/2001 | Maeda |
| 2002/0027080 | A1 | 3/2002 | Yoshioka et al. |
| 2002/0029973 | A1 | 3/2002 | Maydan |
| 2002/0084183 | A1 | 7/2002 | Hanson et al. |
| 2002/0084189 | A1 | 7/2002 | Wang et al. |
| 2002/0195352 | A1 | 12/2002 | Mayer et al. |
| 2003/0070941 | A1 | 4/2003 | Hirao |
| 2003/0116439 | A1 | 6/2003 | Seo et al. |
| 2004/0065561 | A1 | 4/2004 | Chalyt et al. |
| 2004/0084315 | A1 | 5/2004 | Mizohata et al. |
| 2004/0188257 | A1 | 9/2004 | Klocke et al. |
| 2004/0198190 | A1 | 10/2004 | Basol et al. |
| 2004/0200725 | A1 | 10/2004 | Yahalom et al. |
| 2004/0231794 | A1 | 11/2004 | Hongo et al. |
| 2004/0262165 | A1 | 12/2004 | Kanda et al. |
| 2005/0026455 | A1 | 2/2005 | Hamada et al. |
| 2005/0145482 | A1 | 7/2005 | Suzuki et al. |
| 2005/0255414 | A1 | 11/2005 | Inabe et al. |
| 2006/0065536 | A1 | 3/2006 | Jentz et al. |
| 2006/0102485 | A1 | 5/2006 | Nakano et al. |
| 2006/0141157 | A1 | 6/2006 | Sekimoto et al. |
| 2006/0207886 | A1 | 9/2006 | Isono et al. |
| 2006/0266393 | A1 | 11/2006 | Verhaverbeke et al. |
| 2006/0283710 | A1 | 12/2006 | Cohen et al. |
| 2008/0041423 | A1 | 2/2008 | Hardikar et al. |
| 2008/0149487 | A1 | 6/2008 | Lee |
| 2008/0200018 | A1 | 8/2008 | Kawamoto |
| 2009/0183992 | A1* | 7/2009 | Fredenberg ......... B81C 99/0085 205/82 |
| 2010/0032310 | A1 | 2/2010 | Reid et al. |
| 2010/0044236 | A1 | 2/2010 | Mayer et al. |
| 2010/0084275 | A1 | 4/2010 | Hanafusa |
| 2010/0116672 | A1 | 5/2010 | Mayer et al. |
| 2010/0163078 | A1 | 7/2010 | Hsu et al. |
| 2010/0200412 | A1 | 8/2010 | Reid et al. |
| 2010/0200960 | A1 | 8/2010 | Angyal et al. |
| 2010/0247761 | A1 | 9/2010 | Hashimoto |
| 2010/0320081 | A1 | 12/2010 | Mayer et al. |
| 2010/0320609 | A1* | 12/2010 | Mayer ................ H01L 21/2885 257/773 |
| 2011/0043239 | A1 | 2/2011 | Tomita et al. |
| 2011/0284386 | A1 | 11/2011 | Willey et al. |
| 2012/0175263 | A1 | 7/2012 | Ganesan et al. |
| 2012/0255864 | A1 | 10/2012 | Nagai et al. |
| 2012/0292192 | A1 | 11/2012 | Ranjan et al. |
| 2013/0143071 | A1 | 6/2013 | Kleinle |
| 2013/0171833 | A1 | 7/2013 | Buckalew et al. |
| 2013/0264213 | A1* | 10/2013 | Roeger-Goepfert ... C08G 73/00 205/118 |
| 2014/0097088 | A1 | 4/2014 | Stowell et al. |
| 2014/0230860 | A1 | 8/2014 | Chua et al. |
| 2015/0096883 | A1 | 4/2015 | Mayer et al. |
| 2015/0126030 | A1* | 5/2015 | Yang ................. H01L 21/76879 438/675 |
| 2015/0140814 | A1 | 5/2015 | Thorum |
| 2015/0179458 | A1 | 6/2015 | Mayer et al. |
| 2016/0222535 | A1 | 8/2016 | Zhou et al. |
| 2016/0281255 | A1 | 9/2016 | Buckalew et al. |

FOREIGN PATENT DOCUMENTS

| | | |
|---|---|---|
| CN | 102786879 A | 11/2012 |
| CN | 102804343 A | 11/2012 |
| CN | 103305886 A | 9/2013 |
| EP | 0 860 866 | 8/1998 |
| JP | 06151397 A | 5/1994 |
| JP | H07-72357 B2 | 8/1995 |
| JP | 2003-129283 A | 5/2003 |

(56) References Cited

FOREIGN PATENT DOCUMENTS

| JP | 2006-004955 | 1/2006 |
|---|---|---|
| JP | 2007-138304 | 6/2007 |
| JP | 2009-064599 | 3/2009 |
| KR | 10-1999-0029433 | 4/1999 |
| KR | 10-2001-0052062 | 6/2001 |
| KR | 10-2004-0020882 | 3/2004 |
| TW | 200716793 | 5/2007 |
| TW | I281516 | 5/2007 |
| TW | 201109481 A1 | 3/2011 |
| WO | WO 99/10566 | 3/1999 |
| WO | WO 99/41434 | 8/1999 |
| WO | WO 01/68952 | 9/2001 |
| WO | WO 02/062446 | 8/2002 |
| WO | WO 2007/112768 | 10/2007 |
| WO | WO 2010/148147 | 12/2010 |
| WO | WO 2012/022660 | 2/2012 |

OTHER PUBLICATIONS

US Final Office Action, dated Oct. 23, 2015, issued in U.S. Appl. No. 14/085,262.
US Office Action, dated Oct. 23, 2015, issued in U.S. Appl. No. 14/326,899.
US Office Action, dated Jul. 29, 2015, issued in U.S. Appl. No. 13/775,987.
US Notice of Allowance, dated Mar. 14, 2016, issued in U.S. Appl. No. 13/775,987.
US Notice of Allowance (Corrected Notice of Allowability), dated Apr. 26, 2016, issued in U.S. Appl. No. 13/775,987.
Chinese First Office Action dated Nov. 2, 2015 issued in CN 201310676660.7.
Taiwan Office Action dated Mar. 22, 2016 issued in TW Application No. 104118528.
US Office Action, dated Sep. 19, 2016, issued in U.S. Appl. No. 14/102,239.
US Office Action, dated May 20, 2016, issued in U.S. Appl. No. 14/182,767.
US Notice of Allowance, dated May 3, 2016, issued in U.S. Appl. No. 14/085,262.
US Notice of Allowance, dated Jun. 23, 2016, issued in U.S. Appl. No. 14/613,306.
US Notice of Allowability, dated Oct. 12, 2016, issued in U.S. Appl. No. 14/613,306.
US Notice of Allowance, dated May 6, 2016, issued in U.S. Appl. No. 14/326,899.
US Notice of Allowance, dated Aug. 26, 2016, issued in U.S. Appl. No. 14/326,899.
US Notice of Allowance (Corrected Notice of Allowability), dated Jun. 17, 2016, issued in U.S. Appl. No. 13/775,987.
Chinese Second Office Action dated Jun. 20, 2016 issued in Application No. CN 201310676660.7.
Chinese First Office Action dated Aug. 3, 2016 issued in Application No. CN 201410658497.6.
Taiwan Examination and Search Report dated Oct. 13, 2016 issued in Application No. TW 102108847.
Chinese First Office Action dated Jul. 7, 2016 issued in Application No. CN 201310080545.3.
Li, Guang et al., (2002) "Quantitative analysis of HBsAg in vaccinum hepatitis B by high performance capillary zone electrophoresis," *Analytical Instrumentation*, Issue 1, pp. 21-23 [Abstract Only].
U.S. Appl. No. 14/613,306, filed Feb. 3, 2015, entitled "Geometry and Process Optimization for Ultra-High RPM Plating".
U.S. Appl. No. 09/872,340, filed May 31, 2001, entitled "Methods and Apparatus for Bubble Removal in Wafer Wet Processing".
U.S. Appl. No. 14/326,899, filed Jul. 9, 2014, entitled "Apparatus for Wetting Pretreatment for Enhanced Damascene Metal Filling".
U.S. Appl. No. 12/961,274, filed Dec. 6, 2010 entitled "Deionized Water Conditioning System and Methods".
U.S. Appl. No. 13/460,423, filed Apr. 30, 2012, titled "Wetting Wave Front Control for Reduced Air Entrapment During Wafer Entry Into Electroplating Bath."
US Office Action, dated Jun. 5, 2015, issued in U.S. Appl. No. 14/085,262.
US Office Action, dated Aug. 31, 2005, issued in U.S. Appl. No. 09/872,340.
US Office Action, dated Apr. 14, 2005, issued in U.S. Appl. No. 09/872,340.
US Office Action, dated Jan. 18, 2006, issued in U.S. Appl. No. 09/872,340.
US Office Action, dated May 26, 2006, issued in U.S. Appl. No. 09/872,340.
US Office Action, dated Nov. 8, 2006, issued in U.S. Appl. No. 09/872,340.
US Final Office Action, dated Mar. 14, 2007, issued in U.S. Appl. No. 09/872,340.
US Office Action, dated Jun. 27, 2012 in U.S. Appl. No. 12/684,787.
US Office Action, dated Apr. 8, 2013 in U.S. Appl. No. 12/684,787.
US Final Office Action, dated Jul. 24, 2013 in U.S. Appl. No. 12/684,787.
US Office Action, dated Oct. 29, 2013 in U.S. Appl. No. 12/684,787.
US Final Office Action, dated Mar. 3, 2014 in U.S. Appl. No. 12/684,787.
US Office Action, dated Aug. 26, 2014 in U.S. Appl. No. 12/684,787.
US Notice of Allowance, dated Oct. 10, 2014 in U.S. Appl. No. 12/684,787.
US Notice of Allowance (Supplemental Notice of Allowability), dated Oct. 22, 2014 in U.S. Appl. No. 12/684,787.
US Notice of Allowance (Supplemental Notice of Allowability), dated Oct. 28, 2014 in U.S. Appl. No. 12/684,787.
US Office Action, dated Apr. 12, 2011, issued in U.S. Appl. No. 12/684,792.
US Final Office Action, dated Jul. 26, 2011, issued in U.S. Appl. No. 12/684,792.
US Office Action, dated Sep. 27, 2013, issued in U.S. Appl. No. 12/684,792.
US Final Office Action, dated Apr. 10, 2014, issued in U.S. Appl. No. 12/684,792.
US Office Action, dated Jun. 6, 2013, issued in U.S. Appl. No. 12/961,274.
US Final Office Action, dated Oct. 28, 2013, issued in U.S. Appl. No. 12/961,274.
US Notice of Allowance, dated Jan. 21, 2014, issued in U.S. Appl. No. 12/961,274.
US Office Action, dated Jul. 25, 2014, issued in U.S. Appl. No. 12/961,274.
US Final Office Action, dated Nov. 28, 2014, issued in U.S. Appl. No. 12/961,274.
US Notice of Allowance, dated May 27, 2015, issued in U.S. Appl. No. 12/961,274.
US Office Action dated Sep. 30, 2013 in U.S. Appl. No. 13/110,488.
US Final Office Action dated Mar. 14, 2014 in U.S. Appl. No. 13/110,488.
US Office Action dated Jul. 9, 2014 in U.S. Appl. No. 13/110,488.
US Notice of Allowance dated Nov. 21, 2014 in U.S. Appl. No. 13/110,488.
PCT International Search Report and Witten Opinion, dated Jan. 5, 2011, issued in PCT/US2010/038901.
PCT International Preliminary Report on Patentability and Written Opinion dated Jan. 5, 2012, issued in PCT/US2010/038901.
Chinese First Office Action dated Aug. 14, 2014 issued in CN Application No. 201080026847.7.
Korean Office Action, dated Jan. 5, 2012 in KR Application No. 2010-7026340.
Taiwan Office Action dated Nov. 18, 2014 issued in TW Application No. 099119625.
Bozzini et al., (2006) "An electrochemical and in situ SERS study of Cu electrodeposition from acidic sulphate solutions in the presence of 3-diethylamino-7-(4-dimethylaminophenylazo)-5-phenylphenazinium chloride (Janus Green B)", *Journal of Applied Electrochemistry*, 36:973-981.

(56) References Cited

OTHER PUBLICATIONS

Kim, S-K., et al. (2006) "Cationic Surfactants for the Control of Overfill Bumps in Cu Superfilling" *Journal of Electrochemical Society*, 153(12):C826-C833.

Kondo et al., "High Speed Through Silicon Via Filling by Copper Electrodeposition," Electrochemical and Solid State Letters, 13 (5) D26-D28 (2010).

Luhn et al., (2009) "Filling of microvia with an aspect ratio of 5 by copper electrodeposition," *Electrochimica Acta*, 54:2504-2508.

* cited by examiner

PRETREATMENT OF NICKEL AND COBALT LINERS FOR ELECTRODEPOSITION OF COPPER INTO THROUGH SILICON VIAS

FIELD OF THE INVENTION

The embodiments disclosed herein pertain to pretreatment methods for electroplating. More specifically, embodiments relate to pre-wetting methods for treating a semiconductor wafer prior to electrodepositing conductive materials onto the wafer for integrated circuit manufacturing.

BACKGROUND

In integrated circuit manufacturing, a conductive material, such as copper, is often deposited by electroplating onto a seed layer of metal to fill one or more recessed features on the wafer substrate. Electroplating is a method of choice for depositing metal into the vias and trenches of the wafer during damascene processing, and is also used to fill Through-Silicon Vias (TSVs), which are relatively large vertical electrical connections used in 3D integrated circuits and 3D packages.

During electroplating, electrical contacts are made to the seed layer (typically at the periphery of the wafer), and the wafer is electrically biased to serve as a cathode. The wafer is brought into contact with an electroplating solution, which contains ions of metal to be plated, and usually an acid that provides sufficient conductivity to the electroplating solution. For example, typical electroplating solutions for electrodeposition of copper are acidic solutions containing copper sulfate and sulfuric acid or copper methanesulfonate and methanesulfonic acid. The copper plating solutions may also contain organic additives, including classes of additives referred to as accelerators, suppressors, and levelers that modulate electrodeposition rates on different surfaces of the substrate. These plating solutions typically have a pH of less than about 1. Electroplating is typically conducted for an amount of time that is sufficient to fill the recessed features with metal. Then, the unwanted metal deposited on the field regions of the wafer is removed in a planarization operation, such as by a chemical mechanical polishing (CMP).

SUMMARY

One of the problems encountered during electroplating is the formation of voids and defects in the filled recessed features due to damage to the seed layer, and/or due to imbalances of electrolyte composition within the recessed features at the beginning of electroplating. For example, some seed layers are sensitive to the acidic environment of the plating solution and may be subject to corrosion. These acid-sensitive seed layers include nickel-containing layers, such as NiB and NiP layers, and cobalt-containing layers. Nickel-containing seed layers, however, are preferred seed layers in many applications, because they can be deposited by electroless deposition in a highly conformal manner which compares favorably to less conformal physical vapor deposition (PVD) which is typically used to deposit copper. While copper can also be deposited by electroless deposition, it was found that copper deposited by this method exhibits poor adhesion to diffusion barrier layers (such as W and/or WN diffusion barrier layers) that line the substrate and onto which the seed layers are deposited. Nickel layers formed by electroless deposition, in contrast, have good adhesion to such diffusion barrier layers. Nickel layers may act as intermediate layers, which serve both as diffusion barrier layers (preventing diffusion of copper into silicon and/or silicon oxide), as adhesion layers and as seed layers that provide sufficient conductivity on the surface of the wafer for electroplating. The nickel and cobalt layers discussed herein will be referred to as seed layers (or liners), but it is understood that they may serve one or more additional functions in addition to providing the required conductivity at the wafer surface for electroplating.

The nickel and cobalt layers discussed herein can be generally deposited using a variety of methods, including, but not limited to electroless deposition. For example, the nickel containing seed layers maybe be deposited by PVD or chemical vapor deposition (CVD) processes. In one of the preferred embodiments the nickel layer is deposited using an electroless plating process using an electroless plating solution that contains a borane reducing agent, such as dimethylamine borane (DMAB) and a nickel salt resulting in a formation of a nickel seed layer film containing at least one atomic percent of boron.

Embodiments described herein provide a wafer pretreatment method and an apparatus for treating semiconductor wafers having nickel-containing and/or cobalt-containing seed layers prior to electroplating. Provided method is capable of significantly reducing damage to the seed layers and allows void-free electrofill of both small and large recessed features, including damascene recessed features and TSVs. The method is particularly useful for pre-treating wafers prior to electrodeposition of copper from acidic plating solutions, but can also be used for pretreatment of wafers prior to electrodeposition of copper from neutral and basic electroplating solutions. It was unexpectedly discovered that treatment of nickel-containing layers with cupric ($Cu^{2+}$) ions provided at a high concentration in a pretreatment liquid results in passivation of these layers towards corrosion. Addition of an electroplating suppressor (such as a compound from a class of polyalkylene glycols) to the pre-treatment liquid acts in synergy with this passivation and further reduces the formation of voids during subsequent electroplating.

In a first aspect of the invention, a method of electroplating copper onto a wafer substrate comprising one or more recessed features (e.g., TSV's) is provided. The method includes: (a) providing a wafer substrate having an exposed nickel-containing and/or cobalt-containing seed layer on at least a portion of its surface; (b) contacting the wafer substrate with a pre-wetting liquid, the pre-wetting liquid comprising cupric ($Cu^{2+}$) ions at a concentration of at least about 10 g/L (e.g., at least about 30 g/L) and an electroplating suppressor, to pre-wet the seed layer on the wafer substrate; and (c) electrodepositing copper onto the seed layer, wherein the electrodeposited copper at least partially fills the one or more recessed features. The embodiments provided herein can be used for pretreating both nickel-containing (e.g., NiB and NiP) layers and cobalt-containing layers (e.g., alloys of cobalt and tungsten). The methods are particularly useful for pretreating the seed layers prior to electrodepositing copper using an acidic electroplating solution.

The step of contacting the substrate with the pre-wetting liquid can be carried out in a preferred embodiment using a single pre-wetting liquid (an aqueous solution) which contains both copper ions at a concentration of at least about 10 g/L and an electroplating suppressor. In other embodiments, the step of contacting the substrate with the pre-wetting liquid comprises two sub-steps: in a first sub-step the substrate is contacted with a first pre-wetting liquid containing copper ions at a concentration of at least about 10 g/L, and in the second step the substrate is contacted with a second pre-wetting liquid containing the electroplating suppressor, wherein the compositions of the first and second pre-wetting liquids can be different (for example, the first pre-wetting liquid may be free of suppressor; and the second pre-wetting liquid may be free of copper ions). In another embodiment, the order of sub-steps may be reversed, that is, the substrate may be contacted by the first pre-wetting liquid containing a suppressor in a first sub-step, followed by being contacted by the second pre-wetting liquid containing copper ions at a concentration of at least about 10 g/L in the second sub-step. Both the treatment with a single pre-wetting liquid and with two distinct pre-wetting liquids, as described above, fall within the scope of contacting the substrate with a pre-wetting liquid comprising cupric ($Cu^{2+}$) ions at a concentration of at least about 10 g/L and an electroplating suppressor.

The pre-wetting liquid is, in some embodiments, degassed prior to contact with the wafer and the pre-treatment is preferably performed at a subatmospheric pressure to eliminate the possibility of bubble formation within the recessed features.

The pre-wetting liquid preferably contains the electroplating suppressor at a relatively high concentration, e.g., at a concentration of least about 50 ppm. The electroplating suppressor can be, for example, a compound from a class of polyalkylene glycols. In some embodiments, the suppressor is a compound from a class of polyalkylene glycols containing an amino group. As the suppressor is a common component of effective copper plating bath solutions for forming TSV and damascene structures, in some embodiments the suppressor used in the pre-wetting liquid is the same compound that is used in the electroplating solution in the subsequent copper plating process. In some embodiments the concentration of the electroplating suppressor in the pre-wetting liquid is equal to or is greater than the concentration of the electroplating suppressor in the electroplating solution.

Generally, the pH of the pre-wetting liquid can be acidic, neutral or basic. In some embodiments, the pH of the pre-treating liquid is acidic. In some embodiments the pH is less than about 2. The pre-wetting liquid can include an acid, such as sulfuric acid, methanesulfonic acid and mixtures thereof. It is preferable to select the concentration of the cupric ions in the pretreating liquid and in the electroplating solution, such that the concentration of cupric ions in the pre-treating liquid is equal to or greater than the concentration of cupric ions in the electroplating solution used for electroplating copper. In addition to the cupric ions at high concentration and an electroplating suppressor, the pre-treatment liquid may include one or more additional additives selected from the group consisting of a halide (e.g., a chloride or a bromide), an electroplating accelerator, an electroplating leveler and combinations thereof. In some embodiments the pre-wetting liquid and the electroplating solution used for plating copper have the same composition.

In one example, the method involves contacting a nickel-containing seed layer with a pre-wetting liquid comprising an acid, cupric ions at a concentration of at least about 30 g/L, and an electroplating suppressor at a concentration of at least about 50 ppm, wherein the electroplating suppressor is a compound from a class of polyalkylene glycols.

The methods provided herein can be integrated into the processes that involve photolithographic patterning. In some embodiments the methods further include: applying photoresist to the wafer substrate; exposing the photoresist to light; patterning the photoresist and transferring the pattern to the wafer substrate; and selectively removing the photoresist from the wafer substrate.

In another aspect of the invention, an apparatus for electroplating copper on an exposed nickel-containing and/or cobalt-containing seed layer on a wafer substrate comprising one or more recessed features is provided. The apparatus includes: (a) a pre-wetting chamber configured for delivering a pre-wetting liquid onto the wafer substrate; (b) a plating vessel configured for holding a plating solution, wherein the apparatus is configured for electrodepositing copper from the plating solution onto the seed layer on the wafer substrate; and (c) a controller comprising program instructions and/or logic for performing any of the methods provided herein. For example, the apparatus may include program instructions and/or logic for (i) contacting the wafer substrate with a pre-wetting liquid, the pre-wetting liquid comprising cupric ($Cu^{2+}$) ions at a concentration of at least about 10 g/L and an electroplating suppressor to pre-wet the seed layer on the wafer substrate; and (ii) electrodepositing copper onto the seed layer, wherein the electrodeposited copper at least partially fills the one or more recessed features.

In another aspect a system is provided, wherein the system includes an electroplating apparatus provided herein and a stepper.

In another aspect, a non-transitory computer machine-readable medium comprising program instructions is provided. The program instructions for control of an electroplating apparatus comprise code for performing any of the methods described above. For example, the program instructions may include code for: (i) contacting the wafer substrate with a pre-wetting liquid, the pre-wetting liquid comprising cupric ($Cu^{2+}$) ions at a concentration of at least about 10 g/L and an electroplating suppressor to pre-wet the seed layer on the wafer substrate; and (ii) electrodepositing copper onto the seed layer, wherein the electrodeposited copper at least partially fills the one or more recessed features.

These and other features and advantages of the present invention will be described in more detail with reference to the figures and associated description that follows.

DETAILED DESCRIPTION

Figure 1A:
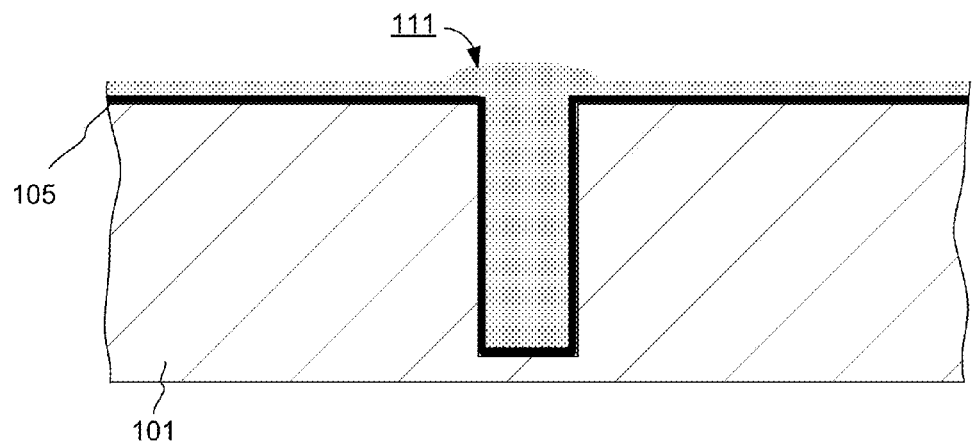
FIG. 1A is a schematic representation of a cross-section of a wafer substrate having a TSV filled with copper, obtained after copper was electroplated onto a copper seed layer pretreated with deionized water.

In the following description, the invention is presented in terms of certain specific configurations and processes to help explain how it may be practiced. The invention is not limited to these specific embodiments. Examples of specific embodiments of the invention are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the scope and equivalents of the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In this disclosure various terms are used to describe a semiconductor work piece. For example, "wafer" and "substrate" are used interchangeably. The term "wafer" or "semiconductor substrate" refers to a substrate that contains semiconductor material anywhere within the workpiece (the semiconductor material does not need to be exposed), and may refer to a full wafer or a portion of the wafer undergoing processing. The process of depositing, or plating, metal onto a conductive surface via an electrochemical reaction is referred to generally as electroplating or electrofilling. The solution that is used for electroplating copper is referred to interchangeably as an electroplating solution and electrolyte. Copper-containing metal in this application is referred to as "copper" which includes without limitation, pure copper metal, copper alloys with other metals, and copper metal impregnated with non-metallic species, such as with organic and inorganic compounds used during electrofill operations (e.g., levelers, accelerators, suppressors, surface-active agents, etc.). The aqueous solution containing cupric ions and an electroplating suppressor that is used to pre-wet the wafer substrate is referred to as the pre-wetting liquid or a pretreatment solution.

The term "suppressor", as used herein, refers to a class of compounds that are capable of adsorbing to the surface of the substrate and suppressing the current at the surface of the substrate during electrodeposition, resulting in reduced copper electrodeposition rate for a given potential. Examples of such compounds include surface-active polymers, such as polyalkylene glycols (e.g. substituted and unsubstituted polyethylene glycols and polypropylene glycols). In some embodiments, a polyalkylene glycol containing an amino group is used as a suppressor.

Electrofilling processes described herein refer to partial or complete filling of recessed features on a substrate with copper. The plating electrolytes include a source of copper ions (copper salt), and, in some embodiments, an acid (e.g., sulfuric acid, methanesulfonic acid or a combination thereof) in order to increase electrolyte conductivity. The plating electrolyte may also include one or more of a suppressor, an accelerator, a leveler and halide ions to modulate the rate of electroplating. Accelerators, such as bis-(3-sulfopropyl) disulfide (SPS) and 3-mercapto-1-propane sulfonic acid (MPS), lower the suppression, leading to accelerated copper deposition. Leveler, such as polyethyleneimine or Janus Green B are often used to improve surface topography of the plated features. In some embodiments, acidic electroplating solutions are used with a pH of less than about 7, such as less than about 2. In other embodiments, neutral or basic electroplating solutions may be employed. In some embodiments, it is preferable to use electrolytes that are optimized for bottom-up fill, which is characterized by accelerated electroplating at the bottom of a recessed feature, and suppressed electroplating a the sidewalls of the recessed feature and at the opening of the recessed feature. In some embodiments, such electrolytes contain copper ions at a high concentration (e.g., 40 g/L or more), a suppressor, an accelerator, a leveler, halide ions, and an acid. In other embodiments, it is preferable to use electrolytes that are optimized to electroplate a conformal or sub-conformal film, which is characterized by electroplating at the bottom of a recessed feature at a rate that is less than (for sub-conformal film) or equal to (for conformal film) the rate of plating at the opening of the recessed feature. In some embodiments, such electrolytes may contain complexing agents that bind with copper ions and increase the potential required for copper electroplating. Examples of commonly used complexing agents are cyanide, citric acid, and ethylenediaminetetraacetic acid (EDTA).

The described pretreatment processes can be practiced on any type of a nickel-containing or cobalt-containing seed layer. In some embodiments the nickel-containing and/or cobalt-containing seed layers are layers deposited by electroless deposition. Nickel-containing and cobalt-containing seed layers may include other elements in addition to nickel and cobalt. Examples of nickel-containing layers are NiB layers and NiP layers, where the formulas do not imply 50% Ni stoichiometry. In some embodiments, the content of the other element (e.g., boron in NiB and phosphorus in NiP) is between about 0.01-50 atomic %, such as about 25 atomic %. Examples of cobalt-containing seed layers include, for example, cobalt-tungsten alloys. In some embodiments nickel-containing and cobalt-containing layers contain nickel or cobalt at a concentration of at least about 40 atomic %.

Provided methods can be used for pretreatments prior to electroplating with any type of electrolyte. The pre-treatment benefits are particularly pronounced before electroplating with highly acidic and corrosive plating solutions, having a pH lower than 3 such as lower than 1, but are not limited to such electrolytes, as it was mentioned above.

Provided methods can be used for filling a variety of recessed features, but are particularly advantageous for filling TSVs, which are recessed features made in a layer of silicon that have relatively large sizes and high aspect ratios. TSVs typically have aspect ratios of 5:1 and greater, such as 10:1 and greater, and even 20:1 and greater (e.g., reaching about 30:1), with widths at opening of about 0.1 µm or greater, such as about 1 µm or greater (e.g., about 5 µm or greater), and depths of about 5 µm or greater, such as about 20 µm or greater (e.g., 50 µm or greater, and 100 µm or greater). Examples of TSVs include 5×50 µm and 10×100 µm features. Such large recessed features, when coated with acid-sensitive seed layers are particularly difficult to fill using conventional techniques. The methods provided herein may also be used for filling smaller recessed features, such as damascene recessed features with widths of opening of about 100 nm or less. Other types of recessed features include those formed in silicon oxide and silicon oxide based materials (e.g. glass), aluminum oxide (e.g. sapphire), polyimide, or other polymer substrates.

The methods provided herein will be primarily illustrated making reference to nickel-containing layers. It is understood that the principles and process conditions presented herein also apply to cobalt-containing layers, and to layers having a combination of nickel and cobalt.

In a conventional TSV processing, a seed layer of copper, deposited in a conformal manner by physical vapor deposition (PVD), serves as a conductive layer to which electrical contact is made during electrodeposition of copper into the TSV features. Prior to electroplating, the copper seed layer is pretreated with deionized water under subatmospheric pressure in a pretreatment chamber to form a wetting layer on the surface of the substrate and to prevent formation of bubbles within the TSV features during electroplating. After pretreatment under subatmospheric pressure, the pretreatment chamber is filled with gas and is brought to atmospheric pressure. The semiconductor substrate containing water as the pre-wetting layer is then transferred to the electroplating vessel. Electroplating is conventionally conducted in an acidic solution containing copper ions and one or more electroplating additives. FIG. 1A illustrates a schematic cross-sectional view of a substrate having a TSV electrofilled with copper using such conventional method. The copper seed layer is not shown. The substrate includes a layer of silicon 101 and a copper-filled via 111 embedded in the silicon. A dielectric liner (not shown) is typically formed on the outer portion of the silicon layer 101 (after the via has been etched into silicon), and resides at the interface with a conformal diffusion barrier layer 105. This dielectric liner (e.g., silicon dioxide or silicon dioxide based material) can be formed by thermal oxidation of the top portion of the silicon layer or by conformal deposition, such as by chemical vapor deposition (CVD) or atomic layer deposition (ALD). The conformal diffusion barrier layer 105, (e.g., Ta, TaN, Ti, TiN, W, WN or a combination thereof) resides on the layer of dielectric liner (not shown) at the interface with copper. The electrodeposited copper layer 111 fills the via without forming any voids and without showing any defects that may be attributed to copper seed layer corrosion.

Figure 1B:
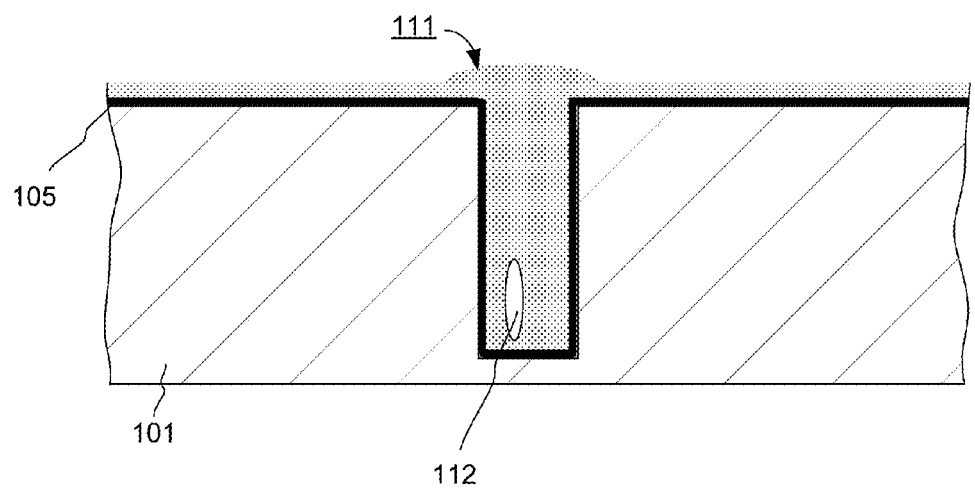
FIG. 1B is a schematic representation of a cross-section of a wafer substrate having a TSV filled with copper, obtained after copper was electroplated onto a NiB seed layer pretreated with deionized water.

Copper seed layers, however, are difficult to deposit onto the above listed diffusion barrier layers with both good adhesion and in a conformal manner. These difficulties are exacerbated when copper is deposited into high aspect ratio recessed features, such as TSVs. Furthermore PVD deposition of copper is expensive relative to wet methods of deposition. Nickel-containing and cobalt-containing layers, which can be deposited conformally and with good adhesion by less expensive methods, such as by electroless deposition, are poised to replace copper seed layers in TSV processing. However, these materials are extremely susceptible to corrosion, and in the absence of a special pretreatment, electroplating on such layers results in formation of voids and other defects. For example, FIG. 1B shows that when conventional pretreatment with deionized water under subatmospheric pressure is practiced on a NiB seed layer, the NiB seed layer behaves differently from a copper seed layer. Under the same conditions, electroplating of copper onto a NiB layer results in formation of a void within the recessed feature due to corrosion of the NiB layer. FIG. 1B shows a substrate after copper was electroplated on a NiB layer using pretreatment and electroplating conditions that were identical to conditions used for the substrate containing copper seed layer shown in FIG. 1A. The NiB seed layer is not shown. It can be seen that a large void 112 is formed within the electrofilled via 111.

It was unexpectedly discovered that pre-treatment of nickel-containing seed layers with cupric ($Cu^{2+}$) ions at a high concentration results in passivation of nickel towards corrosion and leads to reduction of defects in electrodeposition of copper. The substrate is contacted with an aqueous solution containing cupric ions at a concentration of at least about 10 g/L, such as at least about 30 g/L, or at least about 40 g/L. In some embodiments it is preferable to pretreat the substrate with an aqueous solution containing cupric ions at a concentration of between about 40-70 g/L. This finding is unexpected because cupric ions have oxidizing properties relative to nickel and, therefore, can be expected to increase corrosion of the nickel-containing seed layer. While not wishing to be bound by any model or theory, examples of some known half reactions expected to occur between nickel and dissolved copper ions are:

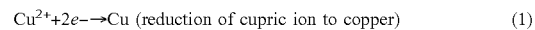

$Cu^{2+}+2e-\rightarrow Cu$ (reduction of cupric ion to copper)　　(1)

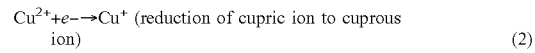

$Cu^{2+}+e-\rightarrow Cu^+$ (reduction of cupric ion to cuprous ion)　　(2)

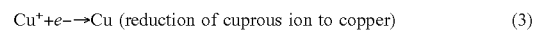

$Cu^++e-\rightarrow Cu$ (reduction of cuprous ion to copper)　　(3)

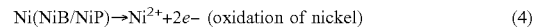

$Ni(NiB/NiP)\rightarrow Ni^{2+}+2e-$ (oxidation of nickel)　　(4)

The combination of half-reactions (1)-(3) could result in the following complete reactions:

$Cu^{2+}+Ni(NiB/NiP)\rightarrow Cu+Ni^{2+}$　　(5)

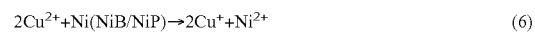

$2Cu^{2+}+Ni(NiB/NiP)\rightarrow 2Cu^++Ni^{2+}$　　(6)

$2Cu^{+1}+Ni(NiB/NiP)\rightarrow Cu+Ni^{+2}$　　(7)

These reactions would be expected to be driven to the right (more driving force for corrosion) if the concentration of cupric ion in the prewetting solution is higher, but the contrary is found to be true. Therefore it is theorized that the process with an initial higher driving force tends to result in the prevention of further reaction (passivation).

Further, unexpectedly, it was discovered that the protective, passivating effect of cupric ions is present not only during electroplating in TSVs, but also during electroplating on blanket wafers that do not have any recessed features. This indicates that this effect is separate from any effects that may be associated with a corrosion potential resulting from the differences in cupric ion concentrations at the top and bottom portions of the recessed feature.

Figure 2A:
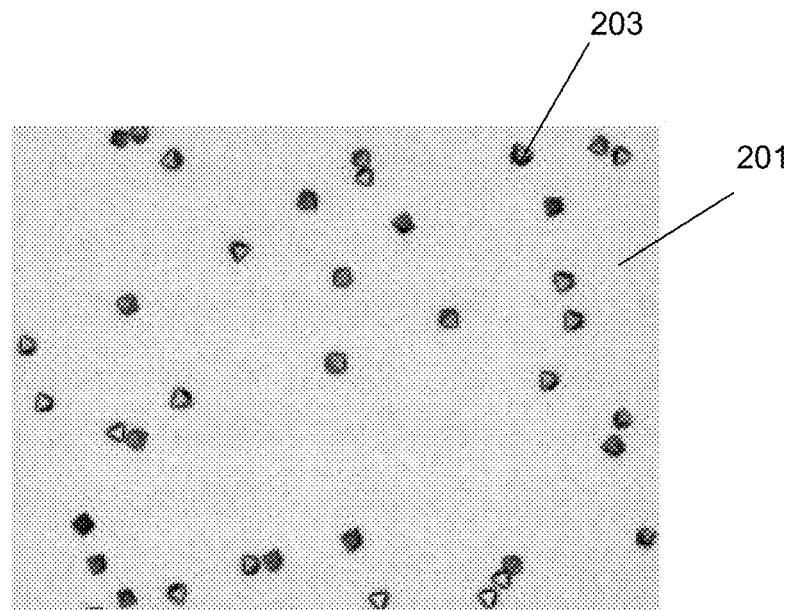
FIG. 2A is a photograph of a top portion of the wafer without recessed features, having a NiB seed layer pretreated with a solution containing cupric ions at a concentration of 5 g/L.
Figure 2B:
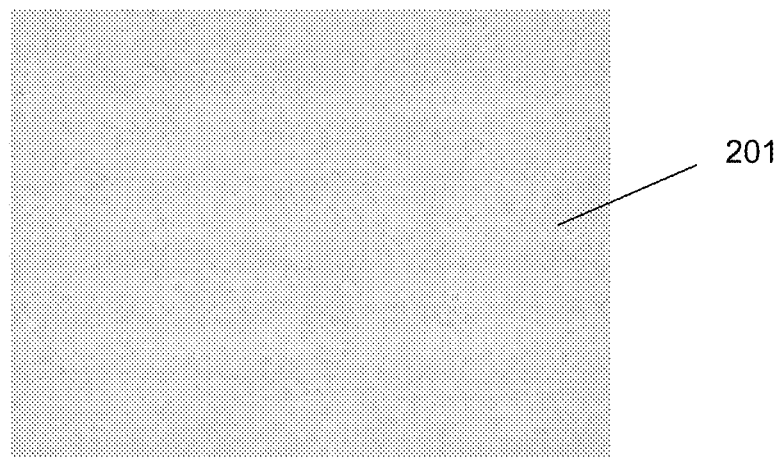
FIG. 2B is a photograph of a top portion of the wafer without recessed features, having a NiB seed layer pretreated with a solution containing cupric ions at a concentration of 60 g/L.

FIGS. 2A and 2B illustrate this effect on a blanket wafer. In a first experiment a wafer without recessed features having a layer of NiB thereon was contacted with a pre-treating liquid consisting of an aqueous solution containing copper (II) sulfate with a low copper concentration of ~5 g/L and was then rinsed with water without further electroplating. FIG. 2A shows a photographic image of the resulting damage to the NiB layer. It can be seen that after such pretreatment the NiB layer 201 exhibits a number of defects 203. Inspection of the defects revealed that they are crystals of metallic Cu formed by a galvanic corrosion reaction between the copper ions and the NiB layer. In another experiment, the wafer without recessed features having a layer of NiB deposited thereon was contacted with a pre-treating liquid consisting of an aqueous solution containing copper (II) sulfate with a high copper concentration of 60 g/L. It can be seen from FIG. 2B that the NiB layer 201 remains free from defects.

Further, unexpectedly, it was discovered that the pre-treatment with cupric ions at high concentration (10 g/L or more) can be performed using acidic pretreating solutions. This is unexpected because nickel-containing and cobalt-containing seed layers are known to be acid-sensitive, and would be expected to quickly corrode in an acidic pretreating environment. Because the reduction potential of nickel and cobalt are more negative relative to the standard reduction potential for the decomposition of water (hydrogen evolution), one typically finds these materials corrode in acidic solutions. The following corrosion reactions are expected to be spontaneous in acidic solutions:

$$Ni + 2H^+ \rightarrow Ni^{2+} + H_2 \qquad (8)$$

$$Co + 2H^+ \rightarrow Co^{2+} + H_2 \qquad (9)$$

Despite these factors, it was found that in a presence of high concentration of cupric ions, such corrosion does not occur and that, in some embodiments, the pretreatment liquid can have an acidic pH of less than about 2, such as less than about 1. It is understood, that while the use of an acidic pretreatment liquid is advantageous in many embodiments (particularly when the electroplating solution is also acidic), in other embodiments the pH of the pretreatment liquid can be higher than 2, e.g., 7 or higher (as long as the cupric ion remains dissolved in the pretreatment liquid). Finally, it was discovered that the use of cupric ions in high concentration alone in the pre-treatment liquid, may not always be sufficient for void-free electroplating. It was discovered that addition of an electroplating suppressor provided in a relatively high concentration in the pretreatment liquid is needed to prevent formation of voids throughout all of recessed features on the wafer substrate. Without wishing to be limited by the following theory, it is believed that the suppressor, when provided in high concentration, forms a film on the nickel surface and may inhibit charge transfer during reduction of copper on nickel and improve the nucleation of copper on the virgin nickel surface. The high copper concentration in the electrolyte may help drive the copper deposition process sufficiently forward to create a more uniform electrodeposited copper film.

Experimental results for electroplating copper on TSVs using different pretreatment liquids are presented in Table 1.

TABLE 1

Electroplating of copper in TSVs on NiB seed layer using different pretreatment chemistries

| Pre-Treatment Liquid | Deionized (DI) water only | Solution of suppressor in DI water | Solution of Cupric ions at 60 g/L, Sulfuric Acid at 60 g/L and 50 ppm chloride in DI water | Solution of Suppressor, Cupric ions at 60 g/L, Sulfuric Acid at 60 g/L and 50 ppm chloride in DI water |
|---|---|---|---|---|
| Observed TSV fill | Voids were formed in most TSVs | Voids were formed in some TSVs | Voids were formed some TSVs | No voids were formed in the TSVs |

In all of the experiments provided in Table 1, copper was electroplated using identical acidic electroplating solutions containing 60 g/L of cupric ions, 60 g/L $H_2SO_4$, 50 ppm of chloride ions, and MLI HSL-A/B/C accelerator, suppressor, and leveler (available from Moses Lake Industries, Moses Lake, Wash.). MLI HSL-B was used as a suppressor in the pre-treatment liquid. It can be seen that only in the case when both the suppressor and cupric ions at high concentration were present in the pretreatment liquid, the void-free filling was obtained throughout the wafer substrate. In addition, it was shown separately that the pretreatment liquid containing cupric ions at a high concentration and a suppressor may further contain other components, such chloride, an accelerator, a leveler, and a combination thereof, while still maintaining its ability to reduce corrosion of the seed layer and result in a void free fill.

It is also important to note that in some embodiments it is preferable to select the compositions of the pretreatment liquid and of the electroplating solution such that the concentration of cupric ions in the pretreatment liquid is the same or greater than the concentration of cupric ions in the electroplating solution. For example, if an electroplating solution with a concentration of cupric ions of 60 g/L is used, it is preferable to use cupric ions at concentration of 60 g/L or more in the pretreatment liquid. This choice is expected to reduce the corrosion potential in the beginning of electroplating. If the concentration of copper in the pretreating liquid is lower than in the plating bath, after entry of a wafer into an electroplating bath, establishment of an internal corrosion cell due to the different activities of dissolved metals at the wafer surface and within the feature, can occur. The electrochemical potential difference in the solution, between the bottom of the feature and the top of the feature can be expressed by a form of the Nernst equation:

$$\Delta V = \frac{RT}{nF} \ln \frac{C(\text{feature})}{C(\text{surface})} \qquad (10)$$

In equation 10, R is the universal gas constant, T is the absolute temperature, n is the number of electrons for the corrosion reaction, F is Faraday's constant, and C(feature) and C(surface) are the concentrations of metal ions at the two locations. A concentration cell is created, with the corrosion driving potential created by a difference in concentrations as given by equation 1. When using a pre-wetting fluid free of dissolved copper ions or with low concentration of copper ions, the bottom of a feature will encounter a C(feature) concentration that is smaller than the C(surface) for some period of time after immersion into the plating bath containing metal ions. Therefore, a corrosive potential difference will exist between location the bottom of a feature and the surface, with the corrosion potential causing the metal on the walls and bottom of the feature to preferentially oxidize, release electrons, and complete the cycle by combining with the metal ions from the solution at the surface.

In some implementations of the provided methods it is preferable to select the pretreatment liquid and the electroplating solution such that they have the same composition. As used herein, the term "the same composition" refers to the same chemical entities present in the solutions (which may be present at the same or different concentrations). For example, the pretreating liquid and the electroplating solution may both consist essentially of an aqueous solution of a copper salt (e.g., copper sulfate, or copper methanesulfonate), an acid (e.g., sulfuric acid), and the same type of a suppressor (e.g., a molecule from the class of polyalkylene glycols). Optionally, both the pretreatment liquid and the electroplating solution may contain the same type of halide (e.g., chloride), the same type of accelerator, and the same type of leveler. In some embodiments the concentrations of all components of the pretreatment liquid and of the electroplating solution are identical. In one embodiment, the concentrations of all components of the pretreatment liquid and of the electroplating solution are identical, with the exception of cupric ion, which is provided at a higher concentration in the pretreatment liquid than in the electroplating solution. In some embodiments the concentration of the suppressor in the pretreatment liquid is the same as or is greater than the concentration of the suppressor in the electroplating solution.

In some embodiments the pre-wetting liquid contains suppressor, such as a compound from the class of polyalkylene glycols at a concentration of at least about 50 ppm, such as at least about 100 ppm or at least about 150 ppm (e.g., about 200 ppm) and has cupric ions at a concentration of at least about 10 g/L, such as at least about 30 g/L, e.g., between about 40-70 g/L. Such pre-wetting liquid may have a pH of less than about 2.

Figure 3A:
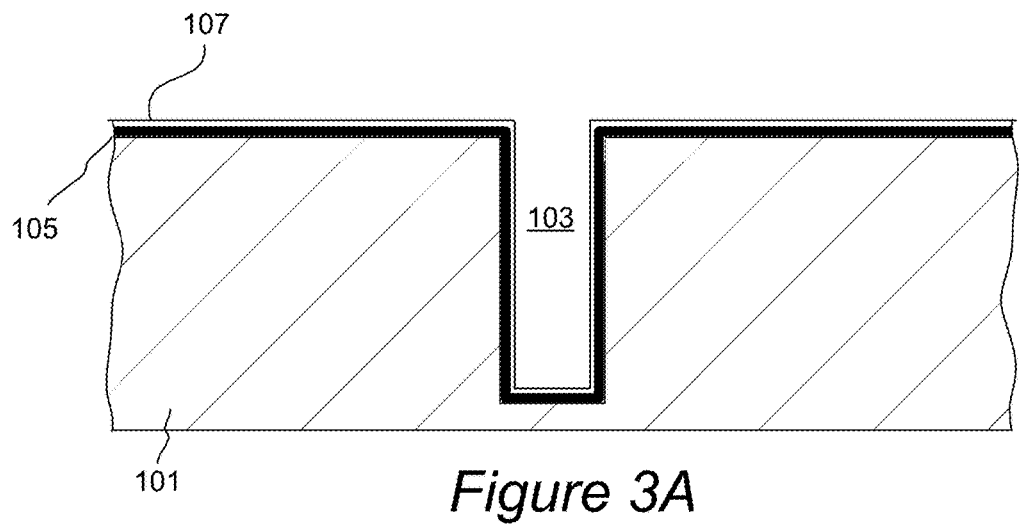
FIGS. 3A-3D present schematic representations of semiconductor device cross-sections at various stages of TSV processing, in accordance with an embodiment presented herein.
Figure 3B:
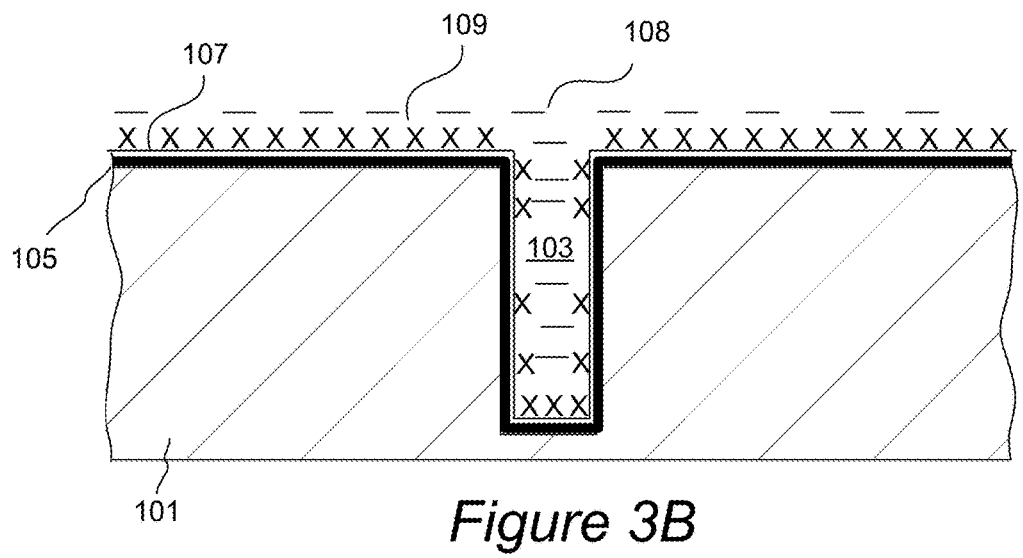
Figure 3C:
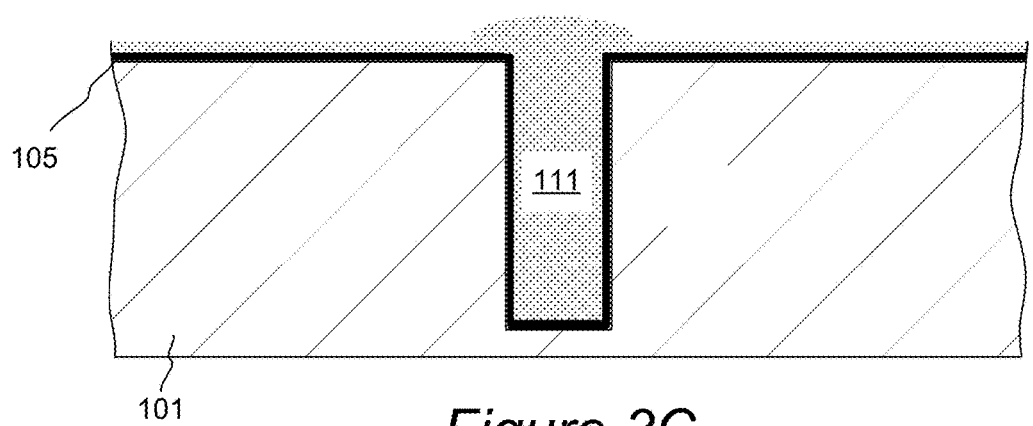
Figure 3D:
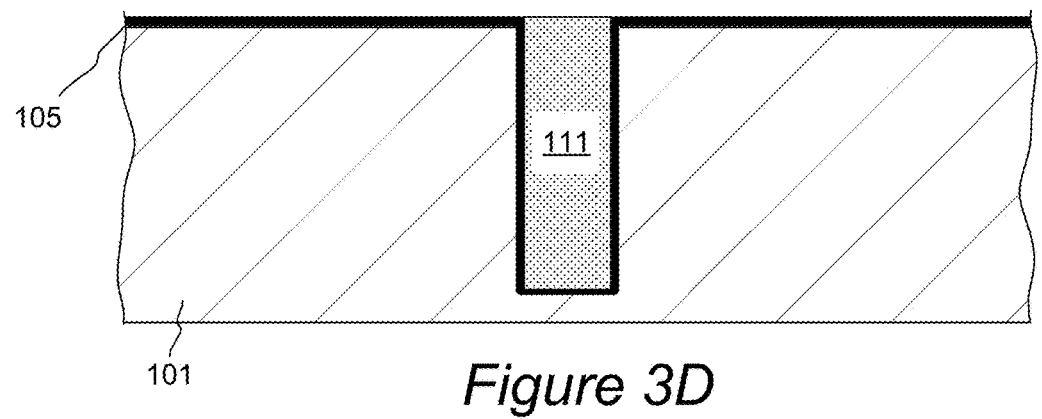
Figure 4:
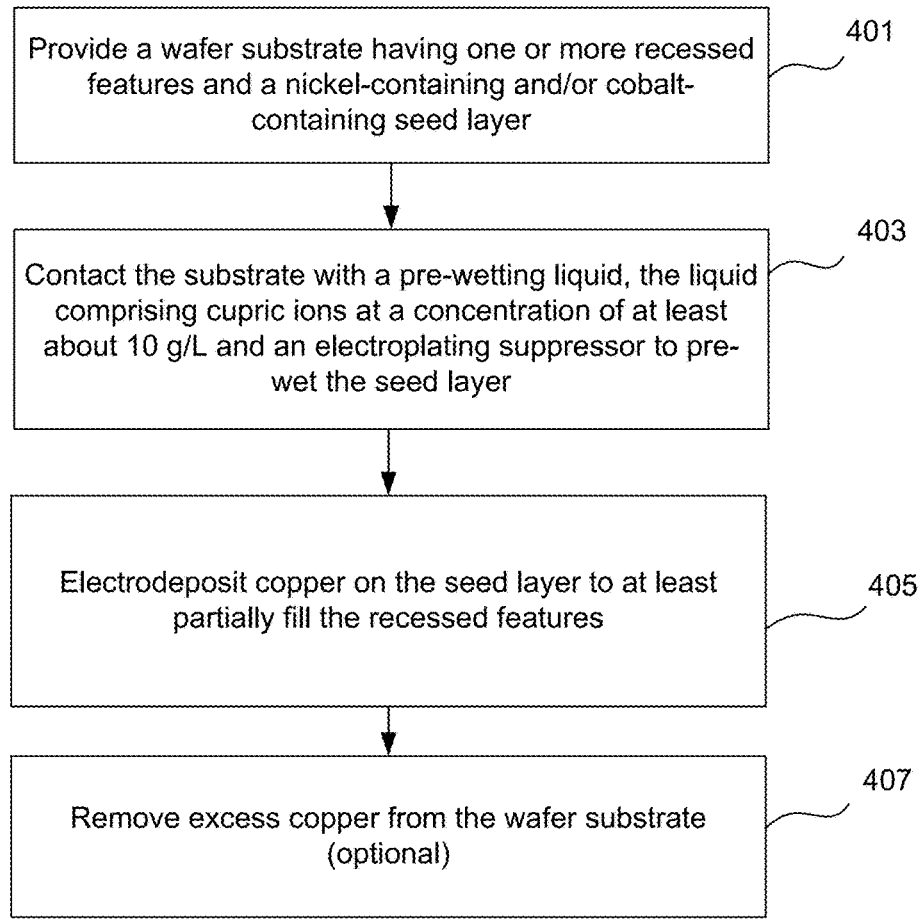
FIG. 4 presents a process flow diagram for a deposition method in accordance with an embodiment provided herein.

The pretreatment method is illustrated by an exemplary process flow diagram shown in FIG. 4 and by a sequence of cross-sectional views of the substrate undergoing processing, shown in FIGS. 3A-3D. In operation 401, a wafer substrate having one or more recessed features and a nickel-containing and/or cobalt-containing seed layer is provided. A cross-sectional view of an example of such substrate is shown in FIG. 3A. FIG. 3A shows a TSV 103 residing in a silicon layer 101. The silicon layer 101 also contains a dielectric conformal liner (not shown) at the interface with the diffusion barrier 105. FIG. 3A shows a portion of the substrate containing one via. In many implementations, the substrate is a semiconductor wafer that contains hundreds, or even millions of vias.

The dielectric-coated silicon layer 101 is lined with the diffusion barrier layer 105 (e.g., Ta, TaN, Ti, TiN, W, WN or a combination thereof), and has a nickel-containing or a cobalt-containing seed layer 107 deposited on the barrier layer 105. The nickel-containing seed layer 107 conformally lines the interior walls of the TSV 103, and also resides on the field region over the diffusion barrier layer. In some embodiments the nickel-containing seed layer is a NiB or NiP layer deposited by electroless deposition. Electroless deposition offers advantages over physical vapor deposition (PVD), because it deposits layers that are more conformal than PVD layers. Alternatively a substantially conformal nickel and/or cobalt seed layer can be deposited by CVD using organometallic nickel and/or cobalt precursors (such as nickel and/or cobalt carbonyls). Nickel and cobalt films, doped with boron and nickel and cobalt films doped with phosphorus can also be conformally deposited by CVD using nickel and cobalt containing precursors and a boron-containing compound (e.g., diborane) for boron-doped films, or a phosphorus-containing compound (e.g., phosphorus pentoxide) for the phosphorus-doped films. In electroless deposition of nickel, the substrate is contacted with a nickel salt and a reducing agent (e.g., a hypophosphate, a dialkylaminoborane, or sodium borohydride) to form a nickel-containing layer. Depending on the nature of the reducing agent, a NiB layer or a NiP layer is formed. For example, the use of boron-containing reducing agent provides NiB layers, and the use of hypophosphate or other phosphorus-containing reducing agent results in formation of NiP layers.

The substrate having the exposed seed layer is then subjected to a pretreatment, as shown in operation 403 of FIG. 4. The substrate is contacted with a prewetting liquid, where the liquid is an aqueous solution containing cupric ions at a concentration of at least about 10 g/L and an electroplating suppressor. In some embodiments the electroplating suppressor is a compound from the class of polyalkylene glycols (e.g., a substituted or unsubstituted polyethylene glycol or a substituted or unsubstituted polypropylene glycol). An example of such suitable electroplating suppressor is HSL-B, available from Moses Lake Industries, Moses Lake, Wash. The suppressor is preferably provided at a relatively high concentration, such as at a concentration of at least about 50 ppm, such as at least about 100 ppm, e.g., about 200 ppm. In some embodiments, the pre-wetting liquid could also contain additives that are used in the electroplating liquid. Use of these compounds during pre-treatment mitigates the problems associated with slow diffusion rate of the additives at the beginning of electroplating. Examples of these additives include halides (e.g., a chloride or a bromide), electroplating accelerators, and levelers.

The pretreatment liquid can be brought into contact with the substrate by any suitable method, such as by spraying of the liquid onto the substrate, streaming the liquid onto the substrate, immersion of the substrate into the liquid, etc. In some embodiments, spraying of the liquid onto a rotating substrate is preferred.

The cross-sectional view of the substrate after the pretreatment is shown in FIG. 3B. A continuous wetting layer 108 of the pre-wetting liquid is formed on the substrate and fills the TSVs 103. The seed layer is passivated by the oxidation with the cupric ions and is further protected from corrosion by a layer of plating suppressor 109 that adsorbs to the surface of the substrate.

Next, in operation 405, copper is electrodeposited onto the substrate to at least partially fill the recessed features. Typically, the recessed features are completely filled with copper and some copper is also deposited in the field region. During electrodeposition, the seed layer is negatively biased (either before immersion into electrolyte or shortly after immersion into electrolyte), such that the wafer substrate serves as a cathode. The substrate is brought into contact with a plating solution, which contains copper ions, and, in some embodiments, an acid. The plating solution may also contain additives. Examples of additives include accelerators, suppressors, and levelers. An exemplary plating solution for deposition of copper includes a copper salt (e.g., copper sulfate) an acid (e.g., sulfuric acid), an accelerator (e.g., bis-(3-sulfopropyl) disulfide, SPS), chloride ions, and a suppressor. Acidic plating solutions are used in some embodiments, particularly when plating is performed on nickel-containing seed layers. In other embodiments, neutral or slightly basic electroplating solutions may be used. These are suitable for plating on both nickel-containing and cobalt-containing seed layers, but may be preferred for plating on cobalt-containing seed layers, due to high acid sensitivity of cobalt.

The structure shown in FIG. 3C illustrates a recessed feature completely filled with copper 111 by electroplating. The underlying seed layer is not shown in this view to preserve clarity. Because the substrate was pretreated with the pretreatment liquid having a high concentration of cupric ions and an electroplating suppressor, voids are not formed within the filled recessed feature.

Next, in operation 407, excess copper is removed from the substrate. In some embodiments, unwanted copper deposited on the field region during electroplating is subsequently removed using, for example, a chemical mechanical polishing, an electrochemical polishing, or a wet etching technique. A structure of a substrate obtained after such metal removal is shown in FIG. 3D. In the illustrated embodiment, the substrate was planarized to remove the electrodeposited copper and the underlying seed layer. In some embodiments, the diffusion barrier layer is then removed by a subsequent planarization operation.

Figure 5:
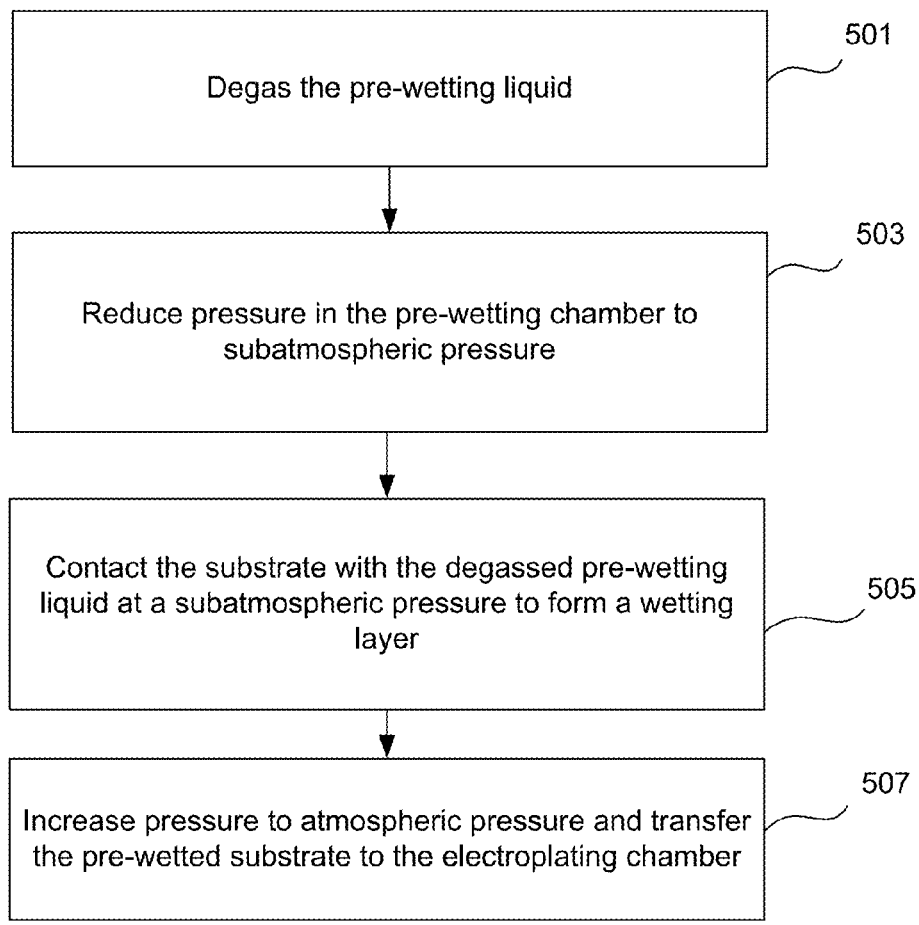
FIG. 5 presents a process flow diagram for a pretreatment method in accordance with an embodiment provided herein.

In some embodiments, particularly when processing substrates with features having widths of greater than 1 micron, special steps are taken to prevent formation of bubbles within the features on the substrate. These embodiments are illustrated by the pre-treatment process flow diagram shown in FIG. 5. In the operation 501, the pre-wetting liquid is degassed. In some embodiments degassing is performed to substantially remove both oxygen and nitrogen from the liquid. Such comprehensive degassing can be performed, for example, by passing the pre-wetting liquid through a membrane contact degasser. Examples of commercially available degassing devices include the Liquid-Cel™ from Membrana of Charlotte, N.C. and the pHasor™ from Entegris of Chaska, Minn. In the operation 503, the pressure in the pre-wetting process chamber that houses the wafer substrate is reduced to subatmospheric pressure. In some embodiments the pressure is reduced to between about 10-100 torr, such as to between about 30-50 torr, such as to about 60 torr. In operation 505, the degassed pre-wetting liquid is brought into contact with the substrate located in the pre-wetting chamber. For example, the substrate may be rotated, while the degassed pre-wetting liquid is sprayed or streamed onto it. A continuous wetting layer is formed as a result of this operation, thereby minimizing the chance of bubble formation during subsequent electroplating. Next, in operation 507, the pressure is increased to atmospheric pressure in the pre-wetting chamber, and the pre-wetted substrate is transferred to the electroplating chamber for subsequent electrodeposition of metal into the recessed features. Details of apparatus and methods for pre-wetting under reduced pressure that can be used in conjunction with the pretreatment liquids provided herein, are described in the U.S. Pat. No. 8,962,085 by Mayer et al., issued on Feb. 24, 2015, titled "Wetting Pretreatment for Enhanced Damascene Metal Filling", which is herein incorporated by reference in its entirety.

In a preferred embodiment, the majority of non-condensable gases (e.g., oxygen and nitrogen) are removed via degassing from both the pre-wetting solution prior to contact with the substrate, and from the electroplating solution prior to electroplating, wherein the degassed pre-wetting solution contacts the substrate under vacuum in order to avoid formation of bubbles. In other embodiments, the majority of non-condensable gases are removed only from the pre-wetting solution but not from the electroplating solution or from the electroplating solution but not from the pre-wetting solution. In another embodiment neither the electroplating solution nor the pre-wetting liquid is degassed.

Figure 6:
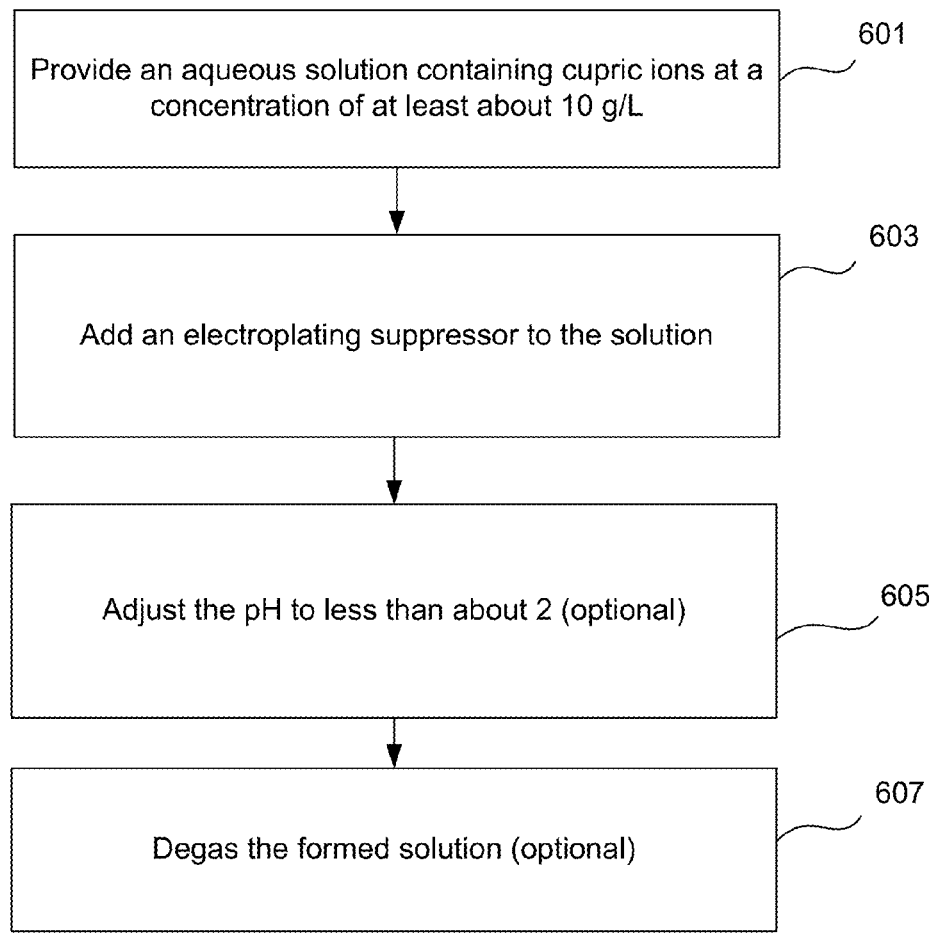
FIG. 6 presents a process flow diagram for a method of preparing a pretreatment solution in accordance with an embodiment provided herein.

The pre-wetting solution suitable for pretreatment described herein can be prepared using a variety of method sequences. FIG. 6 shows one illustrative method for preparation of the prewetting solution containing cupric ions at high concentration. In operation 601, a solution containing cupric ions at a concentration of at least about 10 g/L is provided. Next in operation 603, a suppressor is added to the solution. Optionally, in operation 605 the pH of the pretreatment liquid is adjusted to less than about 2. The formed solution may then be optionally degassed in operation 607. In some embodiments, the pre-wetting solution consists essentially of water, copper salt (e.g., copper sulfate or a copper methanesulfonate) provided at a cupric ion concentration of at least about 10 g/L, a compound from the class of polyalkylene glycols at a concentration of at least about 50 ppm, and an acid, wherein the pH of the solution is less than about 2. In some embodiments, a halide (e.g., chloride or bromide) is also added to this solution.

Generally, it is preferable to apply cupric ions and the suppressor while they are dissolved in a single solution. In other embodiments, the step of contacting the substrate with the pre-wetting liquid comprises two sub-steps: in a first sub-step the substrate is contacted with a first pre-wetting liquid containing copper ions at a concentration of at least about 10 g/L, and in the second step the substrate is contacted with a second pre-wetting liquid containing suppressor, wherein the compositions of the first and second pre-wetting liquids can be different (for example, the first pre-wetting liquid may be free of suppressor; and the second pre-wetting liquid may be free of copper ions). In another embodiment, the order of sub-steps may be reversed, that is, the substrate may be contacted by the first pre-wetting liquid containing a suppressor in a first sub-step, followed by being contacted by the second pre-wetting liquid containing copper ions at a concentration of at least about 10 g/L in the second sub-step. Both treatment with a single pre-wetting liquid and two distinct pre-wetting liquids, as described above, fall within the scope of contacting the substrate with a pre-wetting liquid comprising cupric ($Cu^{2+}$) ions at a concentration of at least about 10 g/L and an electroplating suppressor.

The methods provided herein can be practiced in any type of apparatus which is configured for delivering a pre-wetting liquid onto a wafer. In some embodiments, the pretreatment is performed in a separate pre-wetting chamber that is different from the electroplating chamber. In other embodiments, pre-treatment is performed in the electroplating chamber prior to electroplating. The apparatus further typically includes a controller which contains program instructions and/or built-in logic for performing any of the methods presented herein. The controller may include program instructions for controlling the flow and composition of the pre-wetting liquid provided to the substrate, for regulating the pressure in the pre-wetting chamber, and for electroplating copper on the substrate.

Figure 7:
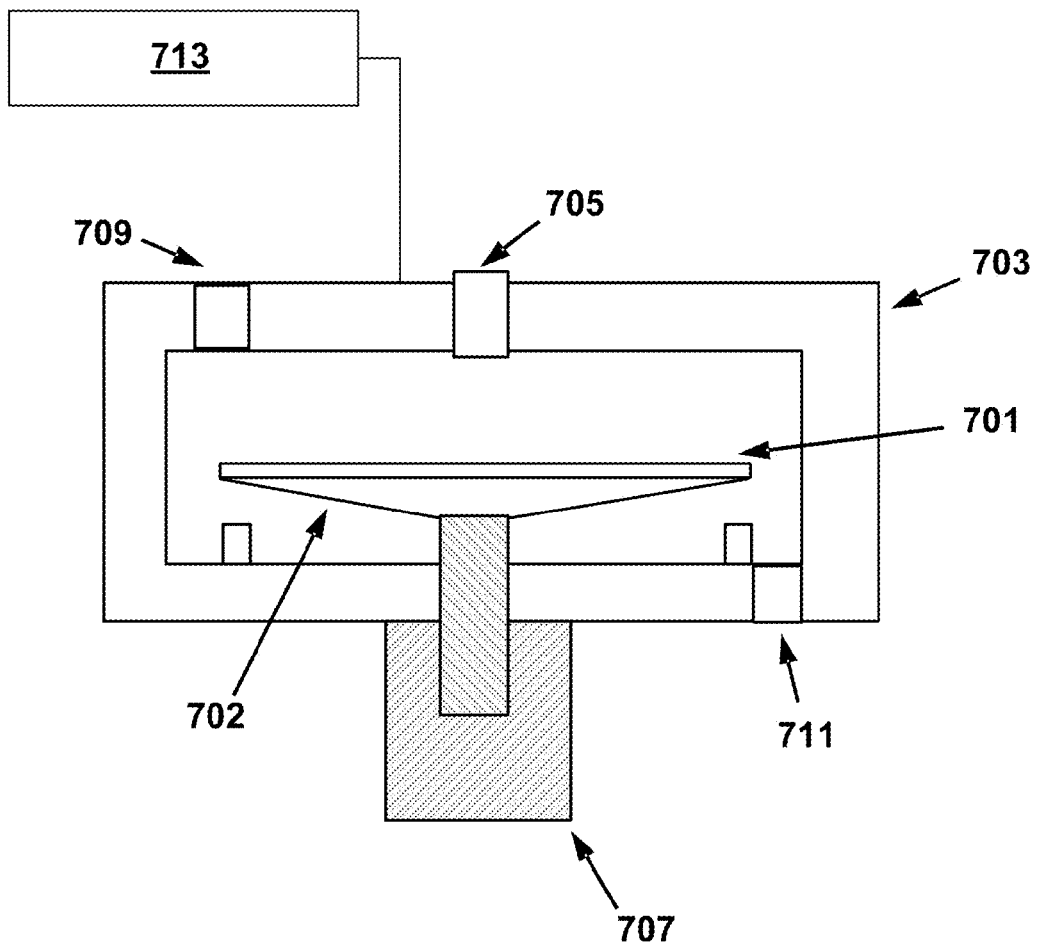
FIG. 7 is a simplified schematic presentation of a pre-wetting process chamber suitable for delivering the pretreatment liquid provided herein.

In some embodiments, the substrate is pre-wetted in a pre-wetting chamber prior to electroplating, such that entrapment of bubbles in the recessed features is avoided. One embodiment of a pre-wetting chamber is shown in FIG. 7. The pre-wetting chamber, shown in this embodiment is configured for spraying or streaming the pre-wetting liquid onto the wafer substrate for a period of time. In FIG. 7, a wafer 701 is held face-up in the pre-wetting chamber 703 with wafer holder 702. In some embodiments, the wafer holder is configured to hold the wafer substrate in substantially a horizontal (e.g., "face-up" or "face-down") orientation during the pre-wetting process. In other embodiments, the wafer holder is configured to hold the wafer substrate in substantially a vertical orientation during the pre-wetting process.

In a typical operation, vacuum is first pulled on chamber 703 though vacuum port 709, which is connected to a vacuum system (not shown). This reduces the pressure in the chamber to a subatmospheric pressure. After much of the gas in the chamber is removed by the vacuum, pre-wetting liquid is delivered onto the wafer surface from the nozzle 705 or other mechanism. In some embodiments, the pre-wetting fluid is degassed prior to contacting the wafer surface to avoid gas being released as the pre-wetting fluid enters the vacuum environment. The wafer may be rotated with motor 707 during the pre-wetting fluid delivery process to ensure complete wetting and exposure of the wafer. In some embodiment, the pre-wetting liquid first contacts the rotating wafer substrate within about 3 cm of the center of the wafer substrate. After pre-wetting, the wafer is spun at a low rotation rate with motor 707 to remove entrained pre-wetting fluid, but leaving a thin layer of fluid on the wafer surface. Excess pre-wetting fluid is drained and exits the vacuum chamber through port 711. The wafer is then transferred to the plating cell such as a Lam Research clamshell cell for plating with a thin layer of pre-wetting fluid retained by surface tension on its surface and within its features. The pre-wetting chamber will also typically include a controller 713 comprising program instructions and/or logic for performing various aspects of the pre-wetting process described herein.

In some embodiments, the pre-wetting chamber and the electroplating chamber are included in one module, which may include a controller with program instructions for transferring the substrate from the pre-wetting chamber to the electroplating chamber, after the pre-wetting has been completed.

Figure 8:
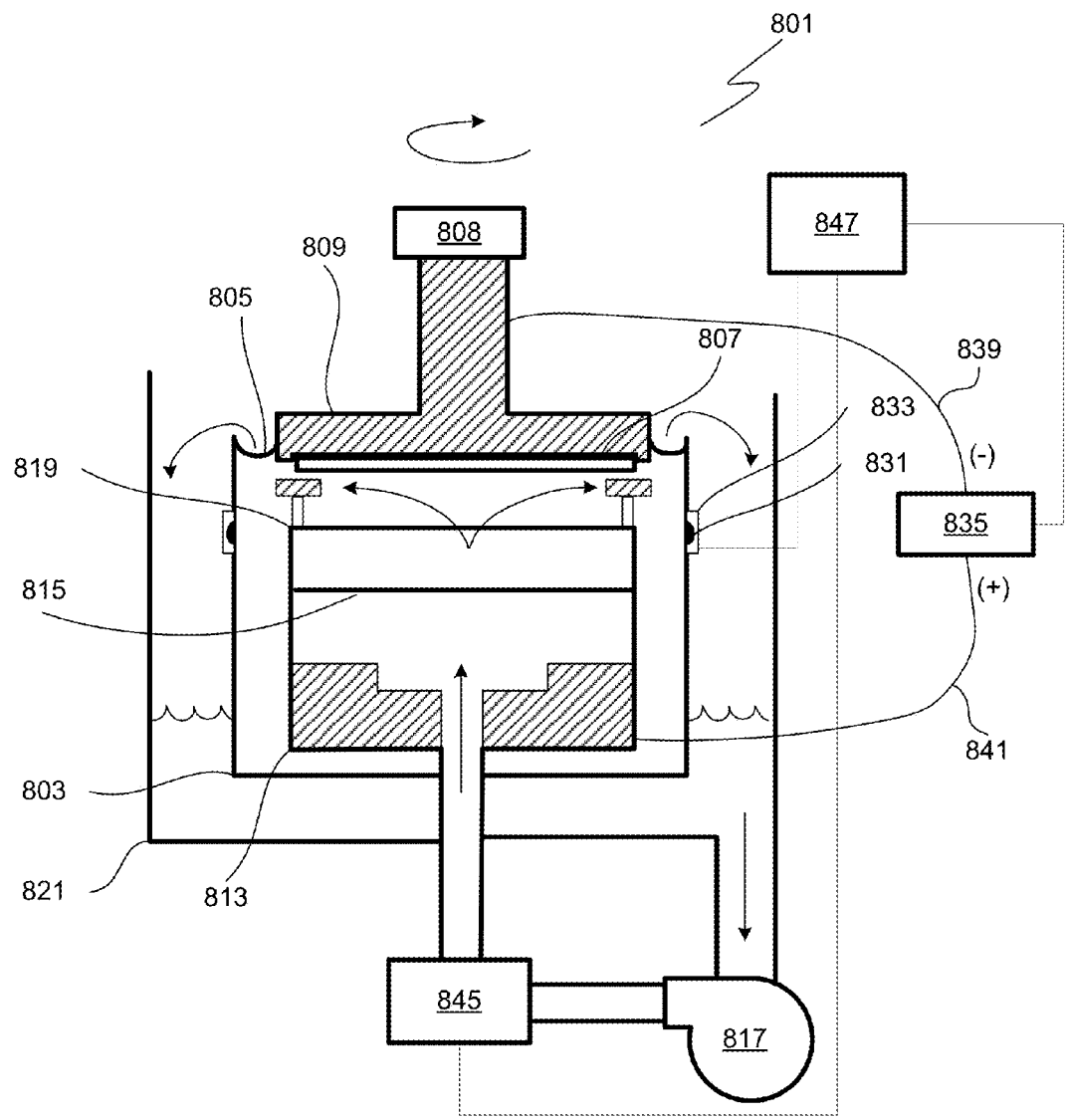
FIG. 8 is a simplified schematic presentation of an electroplating apparatus suitable for filling recessed features in accordance with an embodiment provided herein.

The apparatus in which the electroplating step is implemented, is illustrated in FIG. 8. The apparatus includes one or more electroplating cells in which the substrates (e.g., wafers) are processed. One electroplating cell is shown in FIG. 8 to preserve clarity. To optimize bottom-up electroplating, additives (e.g., accelerators and suppressors) are often added to the electrolyte; however, an electrolyte with additives may react with the anode in undesirable ways. Therefore anodic and cathodic regions of the plating cell are sometimes separated by a membrane so that plating solutions of different composition may be used in each region. Plating solution in the cathodic region is called catholyte; and in the anodic region, anolyte. A number of engineering designs can be used in order to introduce anolyte and catholyte into the plating apparatus.

Referring to FIG. 8, a diagrammatical cross-sectional view of an electroplating apparatus 801 in accordance with one embodiment is shown. The plating bath 803 contains the plating solution, which is shown at a level 805. The catholyte portion of this vessel is adapted for receiving substrates in a catholyte. A wafer 807 is immersed into the plating solution and is held by, e.g., a "clamshell" holding fixture 809, mounted on a rotatable spindle 811, which allows rotation of clamshell 809 together with the wafer 807. A general description of a clamshell-type plating apparatus having aspects suitable for use with this invention is described in detail in U.S. Pat. No. 6,156,167 issued to Patton et al., and U.S. Pat. No. 6,800,187 issued to Reid et al, which are incorporated herein by reference for all purposes.

An anode 813 is disposed below the wafer within the plating bath 803 and is separated from the wafer region by a membrane 815, preferably an ion selective membrane. For example, Nafion™ cationic exchange membrane (CEM) may be used. The region below the anodic membrane is often referred to as an "anode chamber." The ion-selective anode membrane 815 allows ionic communication between the anodic and cathodic regions of the plating cell, while preventing the particles generated at the anode from entering the proximity of the wafer and contaminating it. The anode membrane is also useful in redistributing current flow during the plating process and thereby improving the plating uniformity. Detailed descriptions of suitable anodic membranes are provided in U.S. Pat. Nos. 6,126,798 and 6,569,299 issued to Reid et al., both incorporated herein by reference for all purposes. Ion exchange membranes, such as cationic exchange membranes are especially suitable for these applications. These membranes are typically made of ionomeric materials, such as perfluorinated co-polymers containing sulfonic groups (e.g. Nafion™), sulfonated polyimides, and other materials known to those of skill in the art to be suitable for cation exchange. Selected examples of suitable Nafion™ membranes include N324 and N424 membranes available from Dupont de Nemours Co.

During plating the ions from the plating solution are deposited on the substrate. The metal ions must diffuse through the diffusion boundary layer and into the TSV hole. A typical way to assist the diffusion is through convection flow of the electroplating solution provided by the pump 817. Additionally, a vibration agitation or sonic agitation member may be used as well as wafer rotation. For example, a vibration transducer 808 may be attached to the wafer chuck 809.

The plating solution is continuously provided to plating bath 803 by the pump 817. Generally, the plating solution flows upwards through an anode membrane 815 and a diffuser plate 819 to the center of wafer 807 and then radially outward and across wafer 807. The plating solution also may be provided into anodic region of the bath from the side of the plating bath 803. The plating solution then overflows plating bath 803 to an overflow reservoir 821. The plating solution is then filtered (not shown) and returned to pump 817 completing the recirculation of the plating solution. In certain configurations of the plating cell, a distinct electrolyte is circulated through the portion of the plating cell in which the anode is contained while mixing with the main plating solution is prevented using sparingly permeable membranes or ion selective membranes.

A reference electrode 831 is located on the outside of the plating bath 803 in a separate chamber 833, which chamber is replenished by overflow from the main plating bath 803. Alternatively, in some embodiments the reference electrode is positioned as close to the substrate surface as possible, and the reference electrode chamber is connected via a capillary tube or by another method, to the side of the wafer substrate or directly under the wafer substrate. In some of the preferred embodiments, the apparatus further includes contact sense leads that connect to the wafer periphery and which are configured to sense the potential of the metal seed layer at the periphery of the wafer but do not carry any current to the wafer.

A reference electrode 831 is typically employed when electroplating at a controlled potential is desired. The reference electrode 831 may be one of a variety of commonly used types such as mercury/mercury sulfate, silver chloride, saturated calomel, or copper metal. A contact sense lead in direct contact with the wafer 807 may be used in some embodiments, in addition to the reference electrode, for more accurate potential measurement (not shown).

A DC power supply 835 can be used to control current flow to the wafer 807. A power supply capable of supplying pulse current or applying a pulsed voltage may also be suitable, and the pulses may be various combination of forward (plating), off (no plating) and reverse (de plating) segments each of various durations, repeated and/or modulated over the process. The power supply 835 has a negative output lead 839 electrically connected to wafer 807 through one or more slip rings, brushes and contacts (not shown). The positive output lead 841 of power supply 835 is electrically connected to an anode 813 located in plating bath 803. The power supply 835, a reference electrode 831, and a contact sense lead (not shown) can be connected to a system controller 847, which allows, among other functions, modulation of current and potential provided to the elements of electroplating cell. For example, the controller may allow electroplating in potential-controlled and current-controlled regimes. The controller may include program instructions specifying current and voltage levels that need to be applied to various elements of the plating cell, as well as times at which these levels need to be changed. When forward current is applied, the power supply 835 biases the wafer 807 to have a negative potential relative to anode 813. This causes an electrical current to flow from anode 813 to the wafer 807, and an electrochemical reduction (e.g. $Cu^{2+}+2 e^-=Cu^0$) occurs on the wafer surface (the cathode), which results in the deposition of the electrically conductive layer (e.g. copper) on the surfaces of the wafer.

The apparatus may also include a heater 845 for maintaining the temperature of the plating solution at a specific level. The plating solution may be used to transfer the heat to the other elements of the plating bath. For example, when a wafer 807 is loaded into the plating bath the heater 845 and the pump 817 may be turned on to circulate the plating solution through the electroplating apparatus 801, until the temperature throughout the apparatus becomes substantially uniform. In one embodiment the heater is connected to the system controller 847. The system controller 847 may be connected to a thermocouple to receive feedback of the plating solution temperature within the electroplating apparatus and determine the need for additional heating.

The controller will typically include one or more memory devices and one or more processors. The processor may include a CPU or computer, analog and/or digital input/output connections, stepper motor controller boards, etc. In certain embodiments, the controller controls all of the activities of the electroplating apparatus and/or of the pre-wetting chamber.

For example, the controller may include instructions for performing pretreatment and electroplating in accordance with any method described above or in the appended claims. Non-transitory machine-readable media containing instructions for controlling process operations in accordance with the present invention may be coupled to the system controller.

Typically there will be a user interface associated with controller 847. The user interface may include a display screen, graphical software displays of the apparatus and/or process conditions, and user input devices such as pointing devices, keyboards, touch screens, microphones, etc.

The computer program code for controlling electroplating processes can be written in any conventional computer readable programming language: for example, assembly language, C, C++, Pascal, Fortran or others. Compiled object code or script is executed by the processor to perform the tasks identified in the program.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper. In some embodiments the methods described herein will be implemented in a system which comprises an electroplating apparatus and a stepper.

EXPERIMENTAL EXAMPLES

Example 1 (Comparative)

A wafer substrate containing a plurality of vias having 60 μm depth and 6 μm diameter at the opening, was used. The substrate had a NiB seed layer deposited by electroless deposition on a WN/W diffusion barrier bilayer. The substrate was sprayed with a degassed deionized water under subatmospheric pressure to form a wetting layer. The pressure was then increased to atmospheric, and the substrate was transferred from a pre-wetting chamber to an electroplating cell, where copper was electrodeposited to fill the recessed features using an acidic plating solution containing 60 g/L of copper ions, 60 g/L $H_2SO_4$, 50 ppm of chloride ions, and MLI HSL-A/B/C accelerator, suppressor, and leveler (available from Moses Lake Industries, Moses Lake, Wash.). Voids were observed in the scanning electron microscope (SEM) images of cross-sections of the filled vias. Voids were observed at the bottoms of the vias for the vias located in the center and in the middle portions of the wafer. No voids were observed in the vias located at the wafer edge.

Example 2 (Comparative)

The wafer substrate was processed as in the example 1, except that the pre-wetting liquid was a solution of HSL-PT1 (a compound from the class of polyalkylene glycols) available from Moses Lake Industries, Moses Lake, Wash. The voids were observed at the bottom of the vias, for the vias located at the center portion of the wafer. No voids were observed in the vias located in the middle portions of the wafer or at the wafer edge.

Example 3 (Comparative)

The wafer substrate was processed as in the example 1, except that the pre-wetting liquid had the following composition: aqueous solution of copper sulfate at a concentration of copper ions of 60 g/L, sulfuric acid (at a concentration of 60 g/L), chloride (at a concentration of 50 ppm) having a pH of less than about 1. The experiment in this case was conducted on a smaller scale than in Examples 1 and 2, but based on the results the fill performance similar to comparative examples 1 and 2 is expected on a full wafer substrate. Example 4. The wafer substrate was processed as in the example 1, except that the pre-wetting liquid had the following composition: aqueous solution of HSL-B (electroplating suppressor available from Moses Lake Industries, Moses Lake, Wash., at a concentration of 10 mL/L), copper sulfate at a concentration of copper ions of 60 g/L, sulfuric acid (at a concentration of 60 g/L), chloride (at a concentration of 50 ppm) having a pH of about less than 1. No voids were observed in the SEMs of all filled vias in the entirety of the wafer substrate.

The effects of acid and chloride concentration in the pre-wetting liquid were studied by observing the polarization of the blanket wafer and were not found to have a strong effect. Therefore it is expected that the pre-wetting liquid containing high concentration of cupric ions and an electroplating suppressor would be effective for preventing corrosion over a wide range of chloride concentrations (including in the absence of chloride), and over a wide range of pH of the pre-wetting liquid.

Alternative Embodiments

While it is preferable to use cupric ions in the pre-wetting liquid for passivation of nickel and cobalt layers, in alternative embodiments, the curpric ions in the pre-wetting liquid can be substituted by any oxidizing agent that is capable of such passivation. Examples of oxidants include ferric ions, chromate ions, and nitrate ions.

The invention claimed is:

1. A method of electroplating copper on a wafer substrate comprising one or more recessed features, the method comprising:
    (a) providing a wafer substrate having an exposed nickel-containing and/or cobalt-containing seed layer on at least a portion of its surface;
    (b) contacting the wafer substrate with a pre-wetting liquid, the pre-wetting liquid comprising cupric ($Cu^{2+}$) ions at a concentration of at least about 10 g/L and an electroplating suppressor at a concentration of at least about 50 ppm, to pre-wet the seed layer on the wafer substrate; and
    (c) electrodepositing copper onto the seed layer, wherein the electrodeposited copper at least partially fills the one or more recessed features.

2. The method of claim 1, wherein the seed layer is a nickel-containing layer.

3. The method of claim 2, wherein the pre-wetting liquid comprises cupric ($Cu^{2+}$) ions at a concentration of at least about 30 g/L.

4. The method of claim 2, wherein the electroplating suppressor is a compound from a class of polyalkylene glycols.

5. The method of claim 2, wherein the electroplating suppressor is a compound from a class of polyalkylene glycols containing an amino group.

6. The method of claim 2, wherein pH of the pre-wetting liquid is less than about 2.

7. The method of claim 2, further comprising degassing the pre-wetting liquid prior to contacting the wafer substrate.

8. The method of claim 2, wherein the concentration of cupric ions in the pre-wetting liquid is the same as or greater than a concentration of cupric ions in an electroplating solution used for electroplating copper in (c).

9. The method of claim 2, wherein the pre-wetting liquid has the same composition as an electroplating solution used for electroplating copper in (c).

10. The method of claim 2, wherein the pre-wetting liquid further comprises an additive selected from the group consisting of a halide, an electroplating accelerator, an electroplating leveler and combinations thereof.

11. The method of claim 2, wherein the pre-wetting liquid comprises an acid selected from the group consisting of sulfuric acid, methanesulfonic acid and mixtures thereof.

12. The method of claim 2, wherein the nickel-containing layer is a NiB layer.

13. The method of claim 2, wherein the nickel-containing layer is a NiP layer.

14. The method of claim 2, wherein the one or more recessed features are through silicon vias (TSVs).

15. The method of claim 2, wherein the pre-wetting liquid comprises an acid and cupric ions at a concentration of at least about 30 g/L, wherein the electroplating suppressor is a compound from a class of polyalkylene glycols.

16. The method of claim 1, wherein (c) comprises electrodepositing copper onto the seed layer using an acidic electroplating solution.

17. The method of claim 1, wherein the wafer substrate is contacted with the pre-wetting liquid in (b) under subatmospheric pressure.

18. The method of claim 1, further comprising:
applying photoresist to the wafer substrate;
exposing the photoresist to light;
patterning the photoresist and transferring the pattern to the wafer substrate;
and selectively removing the photoresist from the wafer substrate.

* * * * *